US012587200B2

(12) United States Patent
Chen

(10) Patent No.: US 12,587,200 B2
(45) Date of Patent: Mar. 24, 2026

(54) ANALOG-TO-DIGITAL CONVERSION CIRCUIT AND METHOD

(71) Applicant: Nuvoton Technology Corporation, Hsinchu Science Park (TW)

(72) Inventor: Chien-Jung Chen, Jhubei (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 149 days.

(21) Appl. No.: 18/429,668

(22) Filed: Feb. 1, 2024

(65) Prior Publication Data

US 2024/0297658 A1 Sep. 5, 2024

(30) Foreign Application Priority Data

Mar. 2, 2023 (TW) .................................. 112107455

(51) Int. Cl.
*H03M 1/00* (2006.01)
*H03M 1/08* (2006.01)
(52) U.S. Cl.
CPC ..................................... *H03M 1/08* (2013.01)
(58) Field of Classification Search
CPC ........ H03M 1/125; H03M 1/46; H03M 1/462; H03M 1/12; H03M 1/468; H03M 1/38; H03M 1/002; H03M 1/00; H03M 1/06; H03M 1/0624; H03M 1/0697; H03M 1/08; H03M 1/466; H03M 1/001; H03M 1/069; H03M 1/0695; H03M 1/0863; H03M 1/10; H03M 1/1009; H03M 1/1033; H03M 1/1215; H03M 1/124;

H03M 1/1245; H03M 1/52; H03M 1/02; H03M 1/0612; H03M 1/0836; H03M 1/0872; H03M 1/1014; H03M 1/1061; H03M 1/1071; H03M 1/1225; H03M 1/1255; H03M 1/162; H03M 1/181; H03M 1/361; H03M 1/48; H03M 1/60; H03M 1/687; H03M 3/04

(Continued)

(56) References Cited

U.S. PATENT DOCUMENTS 5,822,369 A * 10/1998 Araki ...................... H03M 1/60
327/51
6,922,164 B1 * 7/2005 Piasecki ................ H03M 1/462
341/163

(Continued)

*Primary Examiner* — Linh V Nguyen
(74) *Attorney, Agent, or Firm* — MUNCY, GEISSLER, OLDS & LOWE, P.C.

(57) ABSTRACT

An analog-to-digital conversion circuit is provided. The analog-to-digital conversion circuit includes an analog-to-digital converter (ADC) and a debounce controller. The ADC is configured to sequentially convert an analog input signal into a plurality of conversion bits in response to a plurality of cycles of a clock signal. The debounce controller is configured to sequentially receive the conversion bits in response to each of the cycles of the clock signal. In each of the cycles, the debounce controller is configured to integrate the received conversion bits into conversion data and to determine whether the conversion data exceeds a normal range. When the conversion data exceeds the normal range, the debounce controller is configured to provide an abort signal to the analog-to-digital converter, so that the analog-to-digital converter stops converting the analog input signal.

20 Claims, 5 Drawing Sheets

(58) Field of Classification Search
USPC ........................................ 341/155, 161, 162
See application file for complete search history.

(56) References Cited

U.S. PATENT DOCUMENTS

| | | | | |
|---|---|---|---|---|
| 7,064,694 | B1 * | 6/2006 | Male ...................... | H04N 25/78 |
| | | | | 341/155 |
| 8,339,298 | B1 | 12/2012 | Hagerty | |
| 9,258,008 | B2 * | 2/2016 | Singh .................... | H03M 1/462 |
| 9,509,329 | B2 * | 11/2016 | Baek ...................... | H03K 5/134 |
| 9,621,179 | B1 * | 4/2017 | Maulik .............. | H03M 1/0863 |
| 9,660,664 | B1 * | 5/2017 | Price .................... | H03M 1/125 |
| 9,774,337 | B1 * | 9/2017 | Chao ........................ | H03K 5/24 |
| 11,387,838 | B1 * | 7/2022 | Dyer .................. | H03M 1/1033 |
| 2006/0038712 | A1 | 2/2006 | Harrison et al. | |
| 2019/0036538 | A1 * | 1/2019 | Tanaka ................. | H03M 1/002 |
| 2020/0036387 | A1 * | 1/2020 | Tang .................... | H03M 1/125 |

* cited by examiner

100

| CLK | MSB_b | MSB_S | Determine whether MSB_S exceeds Hth | Determine whether MSB_S is lower than Lth | Comparison result |
|---|---|---|---|---|---|
| 1 | 0 | 0xxx-xxxx-xxxx (1-bit MSB) | MSB_S = Hth (0 = 0) | MSB_S = Lth (0 = 0) | $Lth \leq MSB\_S \leq Hth$ |
| 2 | 0 | 00xx-xxxx-xxxx (2-bit MSB) | MSB_S = Hth (00 = 00) | MSB_S = Lth (00 = 00) | $Lth \leq MSB\_S \leq Hth$ |
| 3 | 1 | 001x-xxxx-xxxx (3-bit MSB) | MSB_S = Hth (001 = 001) | MSB_S > Lth (001 > 000) | $Lth \leq MSB\_S \leq Hth$ |
| 4 | 1 | 0011-xxxx-xxxx (4-bit MSB) | MSB_S = Hth (0011 = 0011) | MSB_S > Lth (0011 > 0001) | $Lth \leq MSB\_S \leq Hth$ |
| 5 | 1 | 0011-1xxx-xxxx (5-bit MSB) | MSB_S = Hth (00111 = 00111) | MSB_S > Lth (00111 > 00011) | $Lth \leq MSB\_S \leq Hth$ |
| 6 | 1 | 0011-11xx-xxxx (6-bit MSB) | MSB_S > Hth (001111 > 001110) | MSB_S > Lth (001111 > 000110) | $MSB\_S > Hth$ |

FIG. 3A

| CLK | MSB_b | MSB_S | Determine whether MSB_S exceeds Hth | Determine whether MSB_S is lower than Lth | Comparison result |
|---|---|---|---|---|---|
| 1 | 0 | 0xxx-xxxx-xxxx (1-bit MSB) | MSB_S = Hth (0 = 0) | MSB_S = Lth (0 = 0) | Lth ≤ MSB_S ≤ Hth |
| 2 | 0 | 00xx-xxxx-xxxx (2-bit MSB) | MSB_S = Hth (00 = 00) | MSB_S = Lth (00 = 00) | Lth ≤ MSB_S ≤ Hth |
| 3 | 0 | 000x-xxxx-xxxx (3-bit MSB) | MSB_S < Hth (000 < 001) | MSB_S = Lth (000 = 000) | Lth ≤ MSB_S ≤ Hth |
| 4 | 1 | 0001-xxxx-xxxx (4-bit MSB) | MSB_S < Hth (0001 < 0011) | MSB_S = Lth (0001 > 0001) | Lth ≤ MSB_S ≤ Hth |
| 5 | 0 | 0001-0xxx-xxxx (5-bit MSB) | MSB_S < Hth (00010 < 00111) | MSB_S < Lth (00010 < 00011) | Lth > MSB_S |

FIG. 3B

ANALOG-TO-DIGITAL CONVERSION CIRCUIT AND METHOD

CROSS REFERENCE TO RELATED APPLICATIONS

This application claims priority of Taiwan Patent Application No. 112107455, filed on Mar. 2, 2023, the entirety of which is incorporated by reference herein.

BACKGROUND OF THE INVENTION

Field of the Invention

The present invention relates to analog-to-digital conversion circuits, and, in particular, to analog-to-digital conversion circuits with debounce function.

Description of the Related Art

Analog-to-digital converters (ADCs) are widely used in various electronic devices or systems, such as medical systems, audio systems, test and measurement equipment, communication systems, and image and video systems.

The analog-to-digital converter can convert an analog signal (such as an analog voltage) into a digital data with multiple bits. The resolution of an analog-to-digital converter is determined by the number of bits in the digital data. In general, the higher the resolution required by the analog-to-digital converter, the higher the precision of the components required, and the more cycles of the clock signal required for the conversion.

BRIEF SUMMARY OF THE INVENTION

An embodiment of the present invention provides an analog-to-digital conversion circuit. The analog-to-digital conversion circuit includes an analog-to-digital converter (ADC) and a debounce controller. The ADC is configured to sequentially convert an analog input signal into a plurality of conversion bits in response to a plurality of cycles of a clock signal. The debounce controller is configured to sequentially receive the conversion bits in response to each of the cycles of the clock signal. In each of the cycles, the debounce controller is configured to integrate the received conversion bits into conversion data and to determine whether the conversion data is outside a normal range. When the conversion data is outside the normal range, the debounce controller is configured to provide an abort signal to the analog-to-digital converter, so that the analog-to-digital converter stops converting the analog input signal.

Furthermore, an embodiment of the present invention provides an analog-to-digital conversion method. In response to a plurality of cycles of a clock signal, an analog input signal is sequentially converted into a plurality of conversion bits using an analog-to-digital converter. In response to each of the cycles of the clock signal, the conversion bit corresponding to the cycle of the clock signal is received by a debounce controller. The received conversion bits are integrated into conversion data. It is determined whether the conversion data is outside the normal range. An abort signal is provided to the analog-to-digital converter when the conversion data is outside the normal range, so that the analog-to-digital converter stops converting the analog input signal.

BRIEF DESCRIPTION OF THE DRAWINGS

The present invention can be more fully understood by reading the subsequent detailed description and examples with references made to the accompanying drawings, wherein:

FIG. 3A shows the operation state of the debounce controller in FIG. 2 according to some embodiments of the invention.

FIG. 3B shows the operation state of the debounce controller in FIG. 2 according to some embodiments of the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
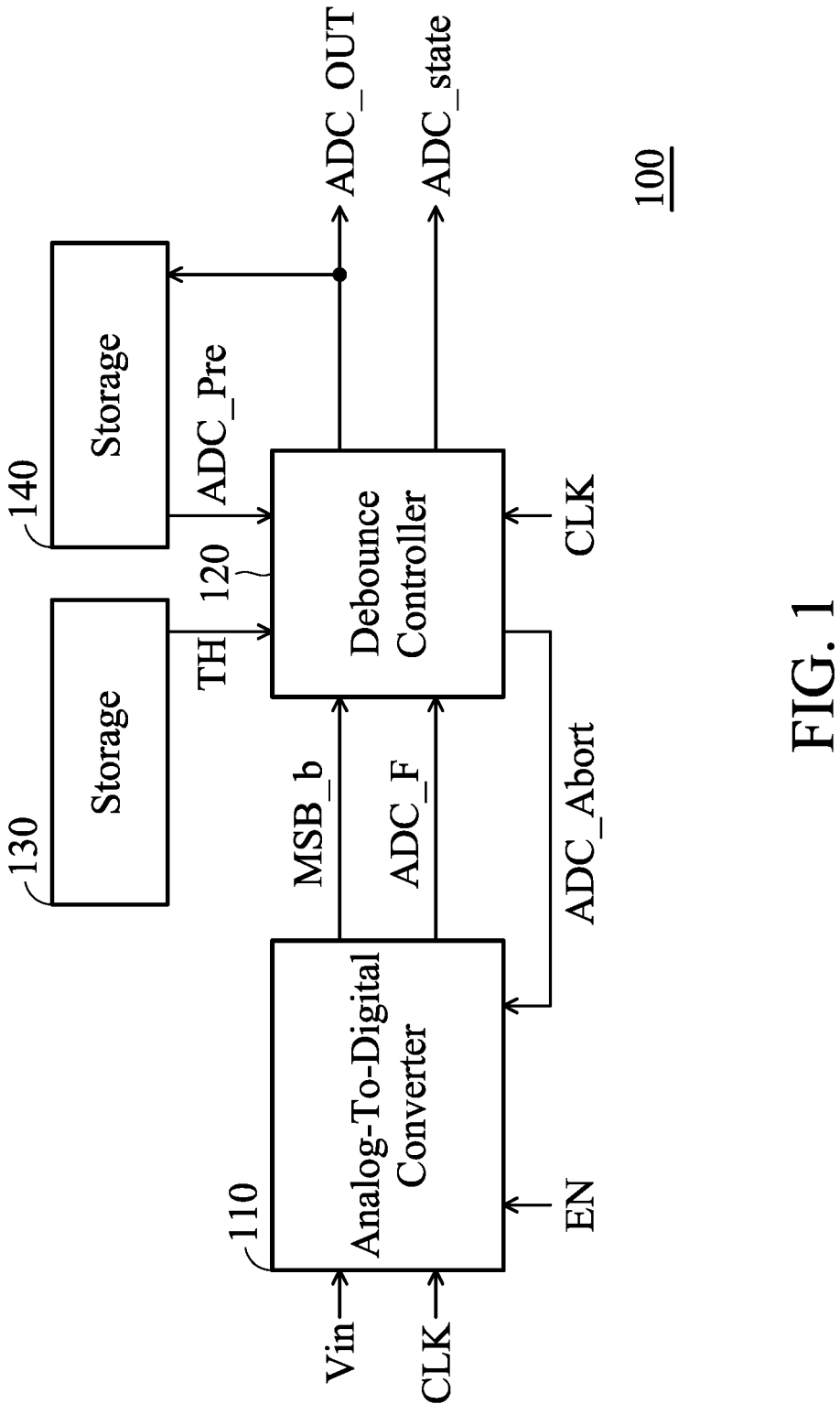
FIG. 1 shows an analog-to-digital conversion circuit according to some embodiments of the invention.

FIG. 1 shows an analog-to-digital conversion circuit 100 according to some embodiments of the invention. The analog-to-digital conversion circuit 100 includes an analog-to-digital converter (ADC) 110, a debounce controller 120, and the storages 130 and 140. The analog-to-digital conversion circuit 100 is configured to convert an analog input signal Vin into a digital output signal ADC_OUT with N bits. In some embodiments, the analog input signal Vin is provided by a sampling circuit (not shown) in response to a sampling period.

The storages 130 and 140 may be the memories or the registers. In some embodiments, the storages 130 and 140 are integrated into the same storage. The storage 130 is configured to store the threshold setting value TH, and the storage 140 is configured to store the previous digital output signal ADC_Pre. The threshold setting value TH is determined according to different applications.

When the analog-to-digital converter 110 is enabled by the control signal EN, the analog-to-digital converter 110 is configured to sequentially convert the analog input signal Vin and output as a single bit from the most significant bit (MSB) to the least significant bit (LSB) in response to the clock signal CLK. In other words, the analog-to-digital converter 110 is configured to output the converted most significant bit as a one-bit conversion bit MSB_b in each cycle of the clock signal CLK. Compared with the traditional analog-to-digital converter which converts all the bits before outputting, the analog-to-digital converter 110 is configured to immediately output the converted data of each bit (i.e., the conversion bit MSB_b).

The analog-to-digital converter 110 is configured to provide the conversion bit MSB_b to the debounce controller 120 in response to each cycle of the clock signal CLK. The debounce controller 120 is configured to receive the corresponding conversion bit MSB_b in response to each cycle of the clock signal CLK, and to determine whether the current conversion result of the analog input signal Vin is outside the normal range (exceeds the normal range) defined by the threshold setting value TH and the previous digital output signal ADC_Pre according to all received conversion bits MSB_b. If the debounce controller 120 determines that the current conversion data is outside the normal range, the debounce controller 120 is configured to provide an abort signal ADC_Abort to the analog-to-digital converter 110, so as to notify the analog-to-digital converter 110 to stop converting the analog input signal Vin.

When the analog input signal Vin changes rapidly, these changes will cause interference and misjudgment of the subsequent devices, thus causing the electronic system to perform wrong operations. In the analog-to-digital conversion circuit 100, the debounce controller 120 is configured to determine whether the received conversion bit MSB_b exceeds the normal range defined by the threshold setting value TH and the previous digital output signal ADC_Pre in response to each cycle of the clock signal CLK, so as to quickly determine whether the analog input signal Vin changes rapidly. For example, in a temperature monitoring system, the detected ambient temperature should change slowly, but abnormal sudden changes in voltage will cause the temperature monitoring system to misjudge that the temperature exceeds the monitoring range and issue false alarms. The detailed operations of the analog-to-digital converter 110 and the debounce controller 120 will be described later. After the analog-to-digital converter 110 completes the conversion of all bits of the analog input signal Vin, the analog-to-digital converter 110 is configured to provide a conversion completion signal ADC_F to notify the debounce controller 120.

When the conversion completion signal ADC_F is received and all the received conversion bits MSB_b are within the normal range, the debounce controller 120 is configured to provide the digital output signal ADC_OUT to the subsequent circuit according to all the received conversion bits MSB_b. Simultaneously, the debounce controller 120 is configured to store the digital output signal ADC_OUT to the storage 140 as the previous digital output signal ADC_Pre for the next conversion. In addition, the debounce controller 120 is further configured to provide a state signal ADC_state to the subsequent circuits, so as to notify that the conversion of the analog input signal Vin is completed.

The debounce controller 120 is configured to determine whether the received conversion bit MSB_b exceeds the normal range defined by the threshold setting value TH and the previous digital output signal ADC_Pre in response to each cycle of the clock signal CLK, so as to quickly determine whether the analog input signal Vin changes rapidly. The debounce controller 120 is configured to stop converting the analog input signal Vin through the abort signal ADC_Abort before the conversion of the analog input signal Vin by the analog-to-digital converter 110 is completed. Since the conversion of the analog input signal Vin is suspended, the debounce controller 120 does not provide the digital output signal ADC_OUT to the subsequent circuits. Furthermore, the debounce controller 120 is further configured to provide the state signal ADC_state to the subsequent circuits, so as to notify that the conversion of the analog input signal Vin has been suspended. Therefore, the subsequent circuits will not operate incorrectly due to the rapidly changing analog input signal Vin. In other words, it can prevent the rapidly changing analog input signal Vin from interfering with the operation of the system, thereby increasing the judgment efficiency and decreasing the power consumption of the system.

Figure 2:
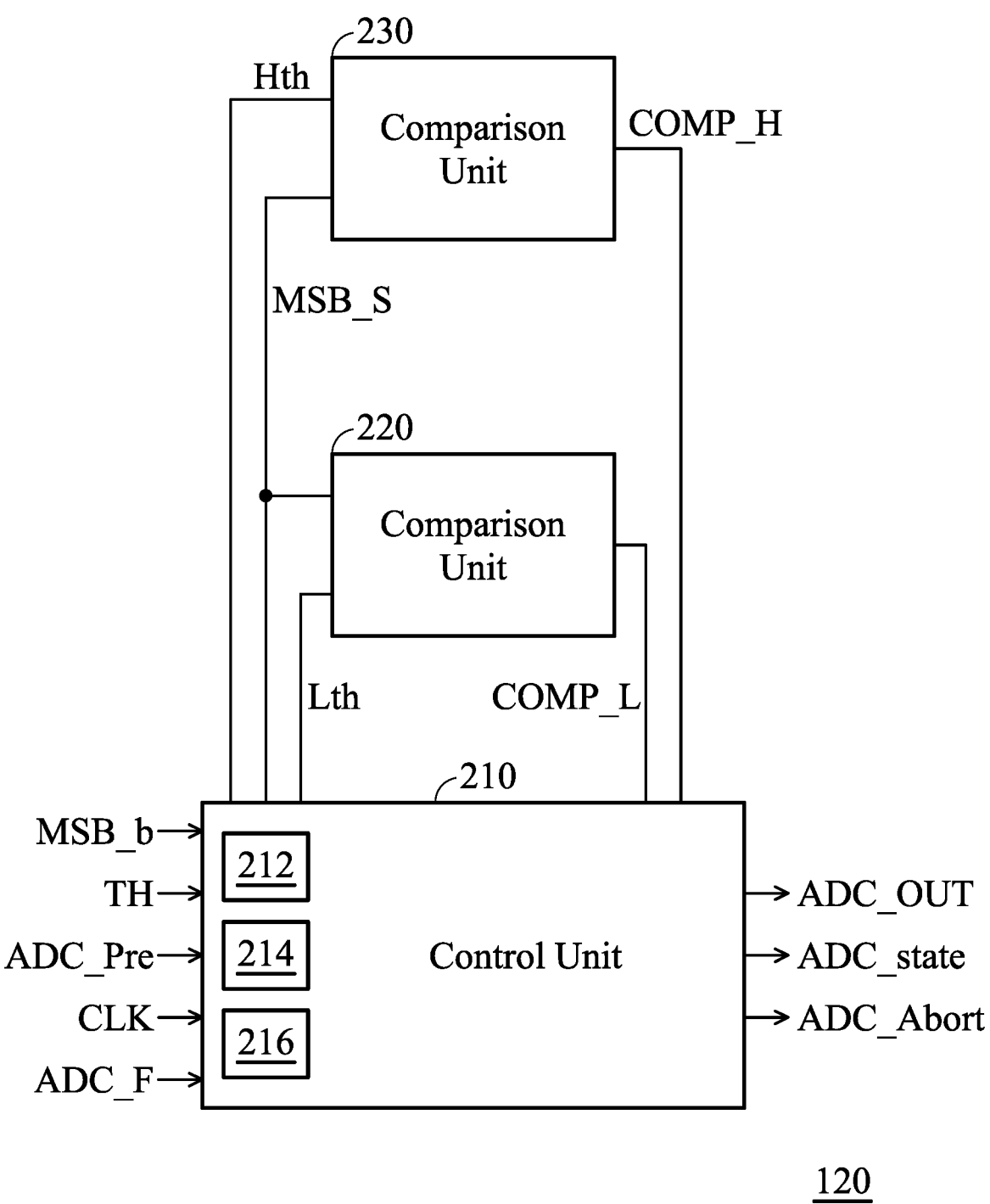
FIG. 2 shows the debounce controller of FIG. 1 according to some embodiments of the invention.

FIG. 2 shows the debounce controller 120 of FIG. 1 according to some embodiments of the invention. The debounce controller 120 includes a control unit 210 and the comparison units 220 and 230. The control unit 210 includes an adder 212, a subtractor 214 and an integrator 216. The adder 212 is configured to add the previous digital output signal ADC_Pre and the threshold setting value TH to obtain the high threshold value (or a upper limit value) Hth, i.e., Hth=ADC_Pre+TH. The subtractor 214 is configured to subtract the threshold setting value TH from the previous digital output signal ADC_Pre to obtain the low threshold value (or lower limit value) Lth, i.e., Lth=ADC_Pre-TH.

The integrator 216 is configured to integrate the conversion bit MSB_b of one bit received individually into the conversion data MSB_S in response to each cycle of the clock signal CLK. In other words, the known number of bits M of the conversion data MSB_S is the same as the sum of the number of conversion bits MSB_b currently received, that is, M conversion bits MSB_b received from the first cycle to the Mth cycle of the clock signal CLK. As described above, the analog-to-digital conversion circuit 100 is configured to convert the analog input signal Vin into the digital output signal ADC_OUT having N bits. Therefore, when the conversion completion signal ADC_F is received, the effective number of bits M of the conversion data MSB_S is equal to N (i.e., M=N). In other words, the analog input signal Vin has been sequentially converted by the analog-to-digital converter 110 into N conversion bits MSB_b.

The comparison unit 220 is configured to compare the conversion data MSB_S with the low threshold value Lth, and to provide the comparison result COMP_L to the control unit 210. For example, when the conversion data MSB_S is smaller than the low threshold value Lth (i.e., MSB_S<Lth), the comparison unit 220 is configured to provide the comparison result COMP_L with a first logic level to the control unit 210. Conversely, when the conversion data MSB_S is greater than or equal to the low threshold value Lth (i.e., MSB_S≥Lth), the comparison unit 220 is configured to provide the comparison result COMP_L with the second logic level to the control unit 210. Moreover, the first logic level is complementary to the second logic level.

The comparison unit 230 is configured to compare the converted data MSB_S with the high threshold value Hth, and to provide the comparison result COMP_H to the control unit 210. For example, when the conversion data MSB_S is greater than the high threshold value Hth (i.e., MSB_S>Hth), the comparison unit 220 is configured to provide a comparison result COMP_H with the first logic level to the control unit 210. Conversely, when the conversion data MSB_S is less than or equal to the high threshold value Hth (i.e., MSB_S≤Hth), the comparison unit 220 is configured to provide the comparison result COMP_H with the second logic level to the control unit 210.

The control unit 210 is configured to determine whether the conversion data MSB_S exceeds of the normal range according to the comparison results COMP_H and COMP_L. Furthermore, the normal range is a range defined by the high threshold value Hth and the low threshold value Lth. When the conversion data MSB_S exceeds the normal range, the control unit 210 is configured to provide the abort signal ADC_Abort to the analog-to-digital converter 110, so as to notify the analog-to-digital converter 110 to stop converting the analog input signal Vin. Simultaneously, the control unit 210 is configured to provide the state signal ADC_state to the subsequent circuits, so as to notify that the conversion of the analog input signal Vin has been suspended.

FIG. 3A shows the operation state of the debounce controller 120 in FIG. 2 according to some embodiments of the invention. In such embodiment, the analog-to-digital conversion circuit 100 with the debounce controller 120 is configured to convert the analog input signal Vin into the digital output signal ADC_OUT with 12 bits. In addition, the 12-bit threshold value TH has a binary value of "0001-0000-0000" (i.e., 0x100), and the previous digital output signal ADC_Pre has a binary value of "0010-1010-0100" (i.e., 0x2A4). Therefore, according to the threshold setting value TH and the previous digital output signal ADC_Pre, the adder 212 is configured to provide the high threshold value Hth with the binary value "0011-1010-0100", and the subtractor 214 is configured to provide the low threshold value Lth with the binary value "0001-1010-0100".

Firstly, in the first cycle of the clock signal CLK, the control unit 210 is configured to receive the conversion bit MSB_b with a binary value "0". Next, according to the conversion bit MSB_b with binary value "0", the integrator 216 is configured to provide the conversion data MSB_S with binary value "0xxx-xxxx-xxxx", where "x" means that the bit is unknown. In other words, in the first cycle of the clock signal CLK, the known bit of the conversion data MSB_S is the one most significant bit (i.e., 1-bit MSB). Next, the comparison unit 230 is configured to compare the one most significant bit of the conversion data MSB_S with the one most significant bit of the high threshold value Hth, and to provides the comparison result COMP_H to indicate whether the conversion data MSB_S exceeds the high threshold value Hth. Simultaneously, the comparison unit 220 is configured to compare the one most significant bit of the conversion data MSB_S with the one most significant bit of the low threshold value Lth, and to provide the comparison result COMP_L to indicate whether the conversion data MSB_S is less than the low threshold value Lth.

In the first cycle of the clock signal CLK, the one most significant bit (i.e. "0") of the conversion data MSB_S is the same as the one most significant bit of the high threshold value Hth (i.e., "0"), and the one most significant bit (i.e., "0") of the conversion data MSB_S is the same as the one most significant bit (i.e., "0") of the lower threshold value Lth. Therefore, the control unit 210 can determine that the conversion data MSB_S is not out of the normal range according to the comparison results COMP_L and COMP_H, i.e., Lth≤MSB_S≤Hth.

In the second cycle of the clock signal CLK, the control unit 210 is configured to receive the conversion bit MSB_b with a binary value of "0". Next, according to the conversion bit MSB_b with the binary value "0", the integrator 216 is configured to provide the conversion data MSB_S with the binary value "00xx-xxxx-xxxx". In other words, in the second cycle of the clock signal CLK, the known bits of the conversion data MSB_S is the 2 most significant bits (i.e., 2-bit MSB). Next, the comparison unit 230 is configured to compare the 2 most significant bits of the conversion data MSB_S with the 2 most significant bits of the high threshold value Hth, and to provide the comparison result COMP_H to indicate whether the conversion data MSB_S exceeds the high threshold value Hth. Simultaneously, the comparison unit 220 is configured to compare the 2 most significant bits of the conversion data MSB_S with the 2 most significant bits of the low threshold value Lth, and to provide the comparison result COMP_L to indicate whether the conversion data MSB_S is less than the low threshold value Lth.

In the second cycle of the clock signal CLK, the 2 most significant bits of the conversion data MSB_S (i.e., "00") is the same as the 2 most significant bits of the high threshold value Hth (i.e., "00"), and the 2 most significant bits (i.e., "00") of the conversion data MSB_S is the same as the 2 most significant bits (i.e., "00") of the low threshold value Lth. Therefore, the control unit 210 can determine that the conversion data MSB_S does not exceed the normal range (i.e., within the normal range) according to the comparison results COMP_L and COMP_H, i.e., Lth≤MSB_S≤Hth.

In the third cycle of the clock signal CLK, the control unit 210 is configured to receive the conversion bit MSB_b with a binary value of "1". Next, according to the conversion bit MSB_b with the binary value "1", the integrator 216 is configured to provide the conversion data MSB_S with the binary value "001x-xxxx-xxxx". In other words, in the third cycle of the clock signal CLK, the known bits of the conversion data MSB_S is the 3 most significant bits (i.e., 3-bit MSB). Next, the comparison unit 230 is configured to compare the 3 most significant bits of the conversion data MSB_S with the 3 most significant bits of the high threshold value Hth, and to provide the comparison result COMP_H to indicate whether the conversion data MSB_S exceeds the high threshold value Hth. Simultaneously, the comparison unit 220 is configured to compare the 3 most significant bits of the conversion data MSB_S with the 3 most significant bits of the low threshold value Lth, and to provide the comparison result COMP_L to indicate whether the conversion data MSB_S is less than the low threshold value Lth.

In the third cycle of the clock signal CLK, the 3 most significant bits of the conversion data MSB_S (i.e., "001") is the same as the 3 most significant bits of the high threshold value Hth (i.e., "001"), and the 3 most significant bits (i.e., "001") of the conversion data MSB_S is greater than the 3 most significant bits (i.e., "000") of the low threshold value Lth. Therefore, the control unit 210 can determine that the conversion data MSB_S does not exceed the normal range according to the comparison results COMP_L and COMP_H, i.e., Lth≤MSB_S≤Hth.

In the fourth cycle of the clock signal CLK, the control unit 210 is configured to receive the conversion bit MSB_b with a binary value of "1". Next, according to the conversion bit MSB_b with the binary value "1", the integrator 216 is configured to provide the conversion data MSB_S with the binary value "0011-xxxx-xxxx". In other words, in the fourth cycle of the clock signal CLK, the known bits of the conversion data MSB_S is the 4 most significant bits (i.e., 4-bit MSB). Next, the comparison unit 230 is configured to compare the 4 most significant bits of the conversion data MSB_S with the 4 most significant bits of the high threshold value Hth, and to provide the comparison result COMP_H to indicate whether the conversion data MSB_S exceeds the high threshold value Hth. Simultaneously, the comparison unit 220 is configured to compare the 4 most significant bits of the conversion data MSB_S with the 4 most significant bits of the low threshold value Lth, and to provide the comparison result COMP_L to indicate whether the conversion data MSB_S is less than the low threshold value Lth.

In the fourth cycle of the clock signal CLK, the 4 most significant bits of the conversion data MSB_S (i.e., "0011") is the same as the 4 most significant bits of the high threshold value Hth (i.e., "0011"), and the 4 most significant bits (i.e., "0011") of the conversion data MSB_S is greater than the 4 most significant bits (i.e., "0001") of the low threshold value Lth. Therefore, the control unit 210 can determine that the conversion data MSB_S does not exceed the normal range according to the comparison results COMP_L and COMP_H, i.e., Lth≤MSB_S≤Hth.

In the fifth cycle of the clock signal CLK, the control unit 210 is configured to receive the conversion bit MSB_b with a binary value of "1". Next, according to the conversion bit MSB_b with the binary value "1", the integrator 216 is configured to provide the conversion data MSB_S with the binary value "0011-1xxx-xxxx". In other words, in the fifth cycle of the clock signal CLK, the known bits of the conversion data MSB_S is the 5 most significant bits (i.e., 5-bit MSB). Next, the comparison unit 230 is configured to compare the 5 most significant bits of the conversion data MSB_S with the 5 most significant bits of the high threshold value Hth, and to provide the comparison result COMP_H to indicate whether the conversion data MSB_S exceeds the high threshold value Hth. Simultaneously, the comparison unit 220 is configured to compare the 5 most significant bits of the conversion data MSB_S with the 5 most significant bits of the low threshold value Lth, and to provide the comparison result COMP_L to indicate whether the conversion data MSB_S is less than the low threshold value Lth.

In the fifth cycle of the clock signal CLK, the 5 most significant bits of the conversion data MSB_S (i.e., "00111") is the same as the 5 most significant bits of the high threshold value Hth (i.e., "00111"), and the 5 most significant bits (i.e., "00111") of the conversion data MSB_S is greater than the 5 most significant bits (i.e., "00011") of the low threshold value Lth. Therefore, the control unit 210 can determine that the conversion data MSB_S does not exceed the normal range according to the comparison results COMP_L and COMP_H, i.e., Lth≤MSB_S≤Hth.

In the sixth cycle of the clock signal CLK, the control unit 210 is configured to receive the conversion bit MSB_b with a binary value of "1". Next, according to the conversion bit MSB_b with the binary value "1", the integrator 216 is configured to provide the conversion data MSB_S with the binary value "0011-11xx-xxxx". In other words, in the sixth cycle of the clock signal CLK, the known bits of the conversion data MSB_S is the 6 most significant bits (i.e., 6-bit MSB). Next, the comparison unit 230 is configured to compare the 6 most significant bits of the conversion data MSB_S with the 6 most significant bits of the high threshold value Hth, and to provide the comparison result COMP_H to indicate whether the conversion data MSB_S exceeds the high threshold value Hth. Simultaneously, the comparison unit 220 is configured to compare the 6 most significant bits of the conversion data MSB_S with the 6 most significant bits of the low threshold value Lth, and to provide the comparison result COMP_L to indicate whether the conversion data MSB_S is less than the low threshold value Lth.

In the sixth cycle of the clock signal CLK, the 6 most significant bits of the conversion data MSB_S (i.e., "001111") is greater than the 6 most significant bits of the high threshold value Hth (i.e., "001110"), and the 6 most significant bits (i.e., "001111") of the conversion data MSB_S is greater than the 6 most significant bits (i.e., "000110") of the low threshold value Lth. Therefore, the control unit 210 can determine that the conversion data MSB_S exceeds the normal range according to the comparison results COMP_L and COMP_H, i.e., MSB_S>Hth. Next, the debounce controller 120 is configured to provide the abort signal ADC_Abort to the analog-to-digital converter 110, so as to notify the analog-to-digital converter 110 to stop converting the analog input signal Vin. Since the conversion of the analog input signal Vin is suspended, the debounce controller 120 does not provide the digital output signal ADC_OUT to the subsequent circuits. Moreover, the debounce controller 120 is further configured to provide the state signal ADC_state to the subsequent circuits, so as to notify the subsequent circuits that the conversion of the analog input signal Vin has been suspended. Therefore, the subsequent circuits will not operate incorrectly due to the rapidly changing analog input signal Vin. In other words, it can prevent the rapidly changing analog input signal Vin from interfering with the subsequent operations, thereby increasing the judgment efficiency and decreasing the power consumption of the system.

FIG. 3B shows the operation state of the debounce controller 120 in FIG. 2 according to some embodiments of the invention. In such embodiment, the analog-to-digital conversion circuit 100 with the debounce controller 120 is configured to convert the analog input signal Vin into the digital output signal ADC_OUT with 12 bits. In addition, the 12-bit threshold value TH has a binary value of "0001-0000-0000" (i.e., 0x100), and the previous digital output signal ADC_Pre has a binary value of "0010-1010-0100" (i.e., 0x2A4). Therefore, according to the threshold setting value TH and the previous digital output signal ADC_Pre, the adder 212 is configured to provide the high threshold value Hth with the binary value "0011-1010-0100", and the subtractor 214 is configured to provide the low threshold value Lth with the binary value "0001-1010-0100".

During the first cycle to the fourth cycle of the clock signal CLK, the control unit 210 sequentially receives the conversion bits MSB_b with binary values "0", "0", "0", and "1". Next, according to the received conversion bits MSB_b, the integrator 216 is configured to provide the corresponding conversion data MSB_S. As described above, the known bit(s) of the conversion data MSB_S is the most significant bit(s) corresponding to the received quantity. The comparison unit 230 is configured to compare the conversion data MSB_S with the high threshold Hth, and to provide a comparison result COMP_H to indicate whether the conversion data MSB_S exceeds the high threshold Hth. Simultaneously, the comparison unit 220 is configured to compare the conversion data MSB_S with the lower threshold Lth, and to provide the comparison result COMP_L to indicate whether the conversion data MSB_S is less than the low threshold value Lth. During the first to fourth cycles of the clock signal CLK, the control unit 210 can determine that the conversion data MSB_S does not exceed the normal range according to the comparison result COMP_L from the comparison unit 220 and the comparison result COMP_H from the comparison unit 230, i.e., Lth≤MSB_S≤Hth.

In the fifth cycle of the clock signal CLK, the control unit 210 is configured to receive the conversion bit MSB_b with a binary value of "0". Next, according to the conversion bit MSB_b with the binary value "0", the integrator 216 is configured to provide the conversion data MSB_S with the binary value "0001-0xxx-xxxx". In other words, in the fifth cycle of the clock signal CLK, the known bits of the conversion data MSB_S is the 5 most significant bits (i.e., 5-bit MSB). Next, the comparison unit 230 is configured to compare the 5 most significant bits of the conversion data MSB_S with the 5 most significant bits of the high threshold value Hth, and to provide the comparison result COMP_H to indicate whether the conversion data MSB_S exceeds the high threshold value Hth. Simultaneously, the comparison unit 220 is configured to compare the 5 most significant bits of the conversion data MSB_S with the 5 most significant bits of the low threshold value Lth, and to provide the comparison result COMP_L to indicate whether the conversion data MSB_S is less than the low threshold value Lth.

In the fifth cycle of the clock signal CLK, the 5 most significant bits of the conversion data MSB_S (i.e., "00010") is less than the 5 most significant bits of the high threshold value Hth (i.e., "00111"), and the 5 most significant bits (i.e., "00010") of the conversion data MSB_S is less than the 5 most significant bits (i.e., "00011") of the low threshold value Lth. Therefore, the control unit 210 can determine that the conversion data MSB_S exceeds the normal range according to the comparison results COMP_L and COMP_H, i.e., MSB_S<Lth. Next, the debounce controller 120 is configured to provide the abort signal ADC_Abort to the analog-to-digital converter 110, so as to notify the analog-to-digital converter 110 to stop converting the analog input signal Vin. Since the conversion of the analog input signal Vin is suspended, the debounce controller 120 does not provide the digital output signal ADC_OUT to the subsequent circuits. Moreover, the debounce controller 120 is further configured to provide the state signal ADC_state to the subsequent circuits, so as to notify the subsequent circuits that the conversion of the analog input signal Vin has been suspended. Therefore, the subsequent circuits will not operate incorrectly due to the rapidly changing analog input signal Vin. In other words, it can prevent the rapidly changing analog input signal Vin from interfering with the subsequent operations, thereby increasing the judgment efficiency and decreasing the power consumption of the system.

Figure 4:
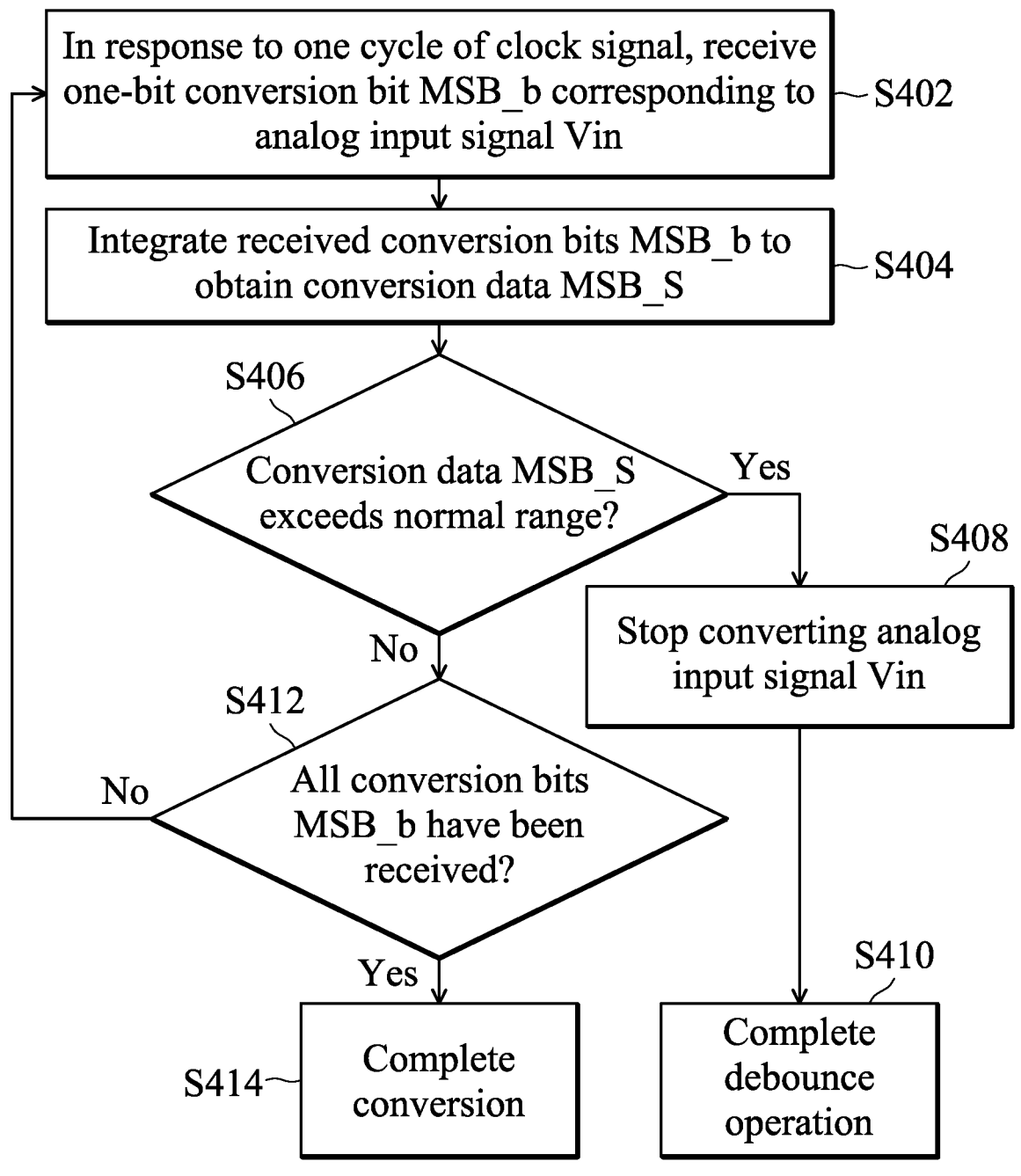
FIG. 4 shows an analog-to-digital conversion method according to some embodiments of the invention.

FIG. 4 shows an analog-to-digital conversion method according to some embodiments of the invention. The analog-to-digital conversion method shown in FIG. 4 is performed by the analog-to-digital conversion circuit 100 shown in FIG. 1. In step S402, in response to one cycle of the clock signal CLK, the debounce controller 120 is configured to receive the one-bit conversion bit MSB_b corresponding to the analog input signal Vin. As previously described, in response to each cycle of the clock signal CLK, the analog-to-digital converter 110 is configured to sequentially convert the analog input signal Vin and output as a single bit from the most significant bit (MSB) to the least significant bit (LSB).

In step S404, the debounce controller 120 is configured to integrate (or merge) the received conversion bits MSB_b to obtain the conversion data MSB_S.

In step S406, the debounce controller 120 is configured to determine whether the conversion data MSB_S exceeds the normal range. As described above, the high threshold value Hth and the low threshold value Lth of the normal range are defined by the threshold setting value TH and the previous digital output signal ADC_Pre. In some embodiments, the low threshold value Lth is obtained by subtracting the threshold setting value TH from the previous digital output signal ADC_Pre, i.e., Lth=ADC_Pre-TH. Furthermore, the high threshold value Hth is obtained by adding the previous digital output signal ADC_Pre and the threshold setting value TH, i.e., Hth=ADC_Pre+TH.

In some embodiments, the high threshold value Hth and the low threshold value Lth are determined by different threshold settings TH. For example, the low threshold value Lth is obtained by subtracting the first threshold setting value TH1 from the previous digital output signal ADC_Pre, i.e., Lth=ADC_Pre-TH1. In addition, the high threshold value Hth is obtained by adding the previous digital output signal ADC_Pre and the second threshold setting value TH2, i.e., Hth=ADC_Pre+TH2.

If the conversion data MSB_S exceeds the normal range (step S406), the debounce controller 120 is configured to provide the abort signal ADC_Abort to the analog-to-digital converter 110, so as to notify the analog-to-digital converter 110 to stop converting the analog input signal Vin (step S408). Next, the analog-to-digital conversion circuit 100 completes the debounce operation (step S410).

If the conversion data MSB_S does not exceed the normal range (step S406), the debounce controller 120 is configured to determine whether all conversion bits MSB_b have been received (step S412). As described above, after converting all the bits of the analog input signal Vin, the analog-to-digital converter 110 is configured to provide the conversion complete signal ADC_F to notify the debounce controller 120. Therefore, when receiving the conversion complete signal ADC_F, the debounce controller 120 may determine that all conversion bits MSB_b have been received. In some embodiments, when N bits of conversion bits MSB_b are continuously received, the debounce controller 120 may determine that all conversion bits MSB_b have been received.

If not all conversion bits MSB_b have been received (step S412), the flow returns to step S402, so as to receive the next conversion bit MSB_b corresponding to the analog input signal Vin in response to the next cycle of the clock signal. If all conversion bits MSB_b have been received (step S412), the conversion of the analog input signal Vin is completed (step S414), and the digital output signal ADC_OUT is output to the subsequent circuits.

In the embodiments of the invention, in response to each cycle of the clock signal CLK, the analog-to-digital converter 110 is configured to sequentially convert the analog input signal Vin and output as a single bit from the most significant bit to the least significant bit. Therefore, the debounce controller 120 is configured to determine whether the current conversion data MSB_S exceeds the normal range according to the received conversion bit MSB_b (that is, determining whether the analog input signal Vin has rapidly change). When it is detected that the conversion data MSB_S exceeds the normal range, the debounce controller 120 is configured to notify the analog-to-digital converter 110 to stop converting the analog input signal Vin. Therefore, rapidly changes in normal voltage can be quickly ruled out to improve the efficiency of the system in monitoring external voltages.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. An analog-to-digital conversion circuit, comprising:
an analog-to-digital converter (ADC) configured to sequentially convert an analog input signal into a plurality of conversion bits in response to a plurality of cycles of a clock signal; and
a debounce controller configured to sequentially receive the conversion bits in response to each of the cycles of the clock signal,
wherein in each of the cycles, the debounce controller is configured to integrate the received conversion bits into conversion data and to determine whether the conversion data exceeds a normal range,
wherein when the conversion data exceeds the normal range, the debounce controller is configured to provide an abort signal to the analog-to-digital converter, so that the analog-to-digital converter stops converting the analog input signal,
wherein a high threshold value of the normal range is obtained by adding a previous digital output signal and a threshold setting value, and wherein a lower threshold value of the normal range is obtained by subtracting the threshold setting value from the previous digital output signal.

2. The analog-to-digital conversion circuit as claimed in claim 1, wherein the known number of bits of the conversion data is the same as the number of the conversion bits received by the debounce controller.

3. The analog-to-digital conversion circuit as claimed in claim 1, wherein when the analog-to-digital converter completes conversion of the analog input signal and the conversion data does not exceed the normal range, the debounce controller is configured to provide a digital output signal corresponding to the analog input signal according to the conversion data.

4. The analog-to-digital conversion circuit as claimed in claim 3, wherein the normal range is determined by the previous digital output signal and the threshold setting value.

5. The analog-to-digital conversion circuit as claimed in claim 4, wherein the debounce controller further comprises:
an adder configured to add the previous digital output signal and the threshold setting value to obtain the high threshold value for the normal range.

6. The analog-to-digital conversion circuit as claimed in claim 5, wherein the debounce controller is configured to compare the conversion data with the high threshold value, and when the conversion data is greater than the high threshold value, the debounce controller is configured to provide the abort signal to the analog-to-digital converter, so that the analog-to-digital converter stops converting the analog input signal.

7. The analog-to-digital conversion circuit as claimed in claim 4, wherein the debounce controller further comprises:
a subtractor configured to subtract the threshold setting value from the previous digital output signal to obtain the lower threshold value of the normal range.

8. The analog-to-digital conversion circuit as claimed in claim 7, wherein the debounce controller is configured to compare the conversion data with the low threshold value, and when the conversion data is less than the low threshold value, the debounce controller is configured to provide the abort signal to the analog-to-digital converter, so that the analog-to-digital converter stops converting the analog input signal.

9. The analog-to-digital conversion circuit as claimed in claim 4, further comprising:
at least one storage configured to store the previous digital output signal and the threshold setting value.

10. The analog-to-digital conversion circuit as claimed in claim 1, wherein the debounce controller is configured to integrate the converted bits into the converted data from the most significant bit (MSB) to the least significant bit (LSB) in response to the cycles of the clock signal.

11. An analog-to-digital conversion method, comprising:
in response to a plurality of cycles of a clock signal, sequentially converting an analog input signal into a plurality of conversion bits, by an analog-to-digital converter;
in response to each of the cycles of the clock signal, receiving the conversion bit corresponding to the cycle of the clock signal, by a debounce controller;
integrating the received conversion bits into conversion data;
determining whether the conversion data exceeds a normal range; and providing an abort signal to the analog-to-digital converter when the conversion data exceeds the normal range, so that the analog-to-digital converter stops converting the analog input signal,
wherein a high threshold value of the normal range is obtained by adding a previous digital output signal and a threshold setting value, and
wherein a lower threshold value of the normal range is obtained by subtracting the threshold setting value from the previous digital output signal.

12. The analog-to-digital conversion method as claimed in claim 11, wherein the known number of bits of the conversion data is the same as the number of the conversion bits received by the debounce controller.

13. The analog-to-digital conversion method as claimed in claim 11, further comprising:
providing a digital output signal corresponding to the analog input signal according to the conversion data when the analog-to-digital converter completes conversion of the analog input signal and the conversion data does not exceed the normal range.

14. The analog-to-digital conversion method as claimed in claim 13, wherein the normal range is determined by the previous digital output signal and the threshold setting value.

15. The analog-to-digital conversion method as claimed in claim 14, wherein the high threshold of the normal range is obtained by adding the previous digital output signal and the threshold set value.

16. The analog-to-digital conversion method as claimed in claim 15, wherein providing the abort signal to the analog-to-digital converter when the conversion data exceeds the normal range further comprises:
comparing the conversion data with the high threshold value; and
providing the abort signal to the analog-to-digital converter when the conversion data is greater than the high threshold value, so that the analog-to-digital converter stops converting the analog input signal.

17. The analog-to-digital conversion method as claimed in claim 14, wherein the low threshold of the normal range is obtained by subtracting the threshold set value from the previous digital output signal.

18. The analog-to-digital conversion method as claimed in claim 17, wherein providing the abort signal to the analog-to-digital converter when the conversion data exceeds the normal range further comprises:
comparing the conversion data with the low threshold value; and
providing the abort signal to the analog-to-digital converter when the conversion data is less than the low threshold value, so that the analog-to-digital converter stops converting the analog input signal.

19. The analog-to-digital conversion method as claimed in claim 14, further comprising:
storing the digital output signal as the previous digital output signal.

20. The analog-to-digital conversion method as claimed in claim 11, wherein integrating the received conversion bits into the conversion data further comprises:
in response to the cycles of the clock signal, integrating the converted bits into the converted data from the most significant bit (MSB) to the least significant bit (LSB).

* * * * *